(12) United States Patent
Pepin et al.

(10) Patent No.: US 9,991,550 B2
(45) Date of Patent: Jun. 5, 2018

(54) METHODS AND DEVICES ASSOCIATED WITH BONDING OF SOLID-STATE LITHIUM BATTERIES

(71) Applicant: Verily Life Sciences LLC, Mountain View, CA (US)

(72) Inventors: Brian Marc Pepin, Oakland, CA (US); Hojr Sedaghat Pisheh, Rohnert Park, CA (US); Dat Phung, San Jose, CA (US); James Etzkorn, Mountain View, CA (US)

(73) Assignee: Verily Life Sciences LLC, Mountain View, CA (US)

( * ) Notice: Subject to any disclaimer, the term of this patent is extended or adjusted under 35 U.S.C. 154(b) by 391 days.

(21) Appl. No.: 14/691,754

(22) Filed: Apr. 21, 2015

(65) Prior Publication Data

US 2016/0254566 A1 Sep. 1, 2016

Related U.S. Application Data

(60) Provisional application No. 62/121,630, filed on Feb. 27, 2015.

(51) Int. Cl.

| | |
|---|---|
| *H01M 10/04* | (2006.01) |
| *H01M 2/22* | (2006.01) |
| *H01M 10/052* | (2010.01) |
| *H05K 3/32* | (2006.01) |
| *H05K 1/02* | (2006.01) |
| *H05K 1/18* | (2006.01) |
| *H05K 3/30* | (2006.01) |

(52) U.S. Cl.
CPC ......... *H01M 10/0436* (2013.01); *H01M 2/22* (2013.01); *H01M 10/052* (2013.01); *H05K 3/321* (2013.01); *H01M 2220/30* (2013.01); *H05K 1/0271* (2013.01); *H05K 1/181* (2013.01); *H05K 3/305* (2013.01); *H05K 2201/10037* (2013.01); *H05K 2201/10477* (2013.01)

(58) Field of Classification Search
CPC .................................................. H05K 1/0271
See application file for complete search history.

(56) References Cited

U.S. PATENT DOCUMENTS

| | | | |
|---|---|---|---|
| 6,134,118 | A | 10/2000 | Pedersen et al. |
| 6,465,082 | B1 | 10/2002 | Takezawa et al. |
| 2007/0117268 | A1 | 5/2007 | Bell |
| 2008/0003493 | A1 | 1/2008 | Bates |
| 2014/0239492 | A1 | 8/2014 | Fujii |
| 2016/0049624 | A1* | 2/2016 | Bhardwaj ............... H01M 2/08 429/162 |

OTHER PUBLICATIONS

International Search Report and Written Opinion of International Application No. PCT/US2016/018398, dated May 19, 2016.

* cited by examiner

*Primary Examiner* — Ladan Mohaddes
(74) *Attorney, Agent, or Firm* — McDonnell Boehnen Hulbert & Berghoff LLP

(57) ABSTRACT

An example device includes a lithium-based battery having conductive battery contacts protruding from a surface of the battery, where a non-conductive portion of the surface of the battery separates the conductive battery contacts. The battery is a type that undergoes an expansion during charging in which the expansion of the lithium-based battery includes an outward bulging of the non-conductive portion of the battery surface. The device includes a substrate having conductive substrate contacts. The conductive battery contacts are electrically connected to the respective conductive substrate contact via a flexible electrically-conductive adhesive that physically separates the conductive battery contacts from the respective conductive substrate contacts and allows for relative movement therebetween caused by the expansion of the lithium-based battery.

10 Claims, 11 Drawing Sheets

METHODS AND DEVICES ASSOCIATED WITH BONDING OF SOLID-STATE LITHIUM BATTERIES

CROSS REFERENCE TO RELATED APPLICATION

The present application claims priority to U.S. Provisional patent application Ser. No. 62/121,630, filed on Feb. 27, 2015, and entitled "Methods and Devices Associated with Bonding of Solid-State Lithium Batteries," which is herein incorporated by reference as if fully set forth in this description.

BACKGROUND

Microelectronic components are widely used in the production of a variety of electronic devices (e.g., wearable computing device, portable computers, mobile device, etc.). Development of such microelectronic devices has brought about the evolution of batteries as miniature power supplies. Such batteries can be, for example, lithium-based batteries.

SUMMARY

The present disclosure describes embodiments that relate to methods and devices associated with bonding of solid-state lithium-based batteries. In one aspect, the present disclosure describes a method. The method includes providing a lithium-based battery having a battery surface and first and second conductive battery contacts protruding from the battery surface. The first and second conductive battery contacts are separated by a non-conductive portion of the battery surface, and the lithium-based battery is a type that undergoes an expansion during charging in which the expansion of the lithium-based battery includes an outward bulging of the non-conductive portion of the battery surface. The method also includes providing a substrate having a substrate surface and first and second conductive substrate contacts protruding from the substrate surface. The first and second conductive substrate contacts are separated by a non-conductive portion of the substrate surface. The method further includes applying a flexible electrically-conductive adhesive to (i) at least one of the first conductive battery contact or the first conductive substrate contact and (ii) at least one of the second conductive battery contact or the second conductive substrate contact. The method also includes coupling the lithium-based battery to the substrate. The coupling includes electrically connecting the first conductive battery contact to the first conductive substrate contact via a first layer of the flexible electrically-conductive adhesive, where the first layer of the flexible electrically-conductive adhesive physically separates the first conductive battery contact from the first conductive substrate contact and allows for relative movement therebetween caused by the expansion of the lithium-based battery. The coupling also includes electrically connecting the second conductive battery contact to the second conductive substrate contact via a second layer of the flexible electrically-conductive adhesive, wherein the second layer of the flexible electrically-conductive adhesive physically separates the second conductive battery contact from the second conductive substrate contact and allows for relative movement therebetween caused by the expansion of the lithium-based battery. The method further includes providing a gap between the non-conductive portion of the battery surface and the non-conductive portion of the substrate surface, where the gap is sufficient to accommodate the outward bulging of the non-conductive portion of the battery surface.

In another aspect, the present disclosure describes a device. The device includes a lithium-based battery having a battery surface and first and second conductive battery contacts protruding from the battery surface. The first and second conductive battery contacts are separated by a non-conductive portion of the battery surface, and the lithium-based battery is a type that undergoes an expansion during charging in which the expansion of the lithium-based battery includes an outward bulging of the non-conductive portion of the battery surface. The device also includes a substrate having a substrate surface and first and second conductive substrate contacts protruding from the substrate surface, where the first and second conductive substrate contacts are separated by a non-conductive portion of the substrate surface. The lithium-based battery is coupled to the substrate such that the first conductive battery contact is electrically connected to the first conductive substrate contact via a first layer of a flexible electrically-conductive adhesive, where the first layer of the flexible electrically-conductive adhesive physically separates the first conductive battery contact from the first conductive substrate contact and allows for relative movement therebetween caused by the expansion of the lithium-based battery. Also, the lithium-based battery is coupled to the substrate such that the second conductive battery contact is electrically connected to the second conductive substrate contact via a second layer of the flexible electrically-conductive adhesive, where the second layer of the flexible electrically-conductive adhesive physically separates the second conductive battery contact from the second conductive substrate contact and allows for relative movement therebetween caused by the expansion of the lithium-based battery. Further, the lithium-based battery is coupled to the substrate such that a gap separates the non-conductive portion of the battery surface and the non-conductive portion of the substrate surface, where the gap is sufficient to accommodate the outward bulging of the non-conductive portion of the battery surface.

In still another aspect, the present disclosure describes a method. The method includes providing a lithium-based battery having a first battery surface and a second battery surface opposite the first battery surface. The first battery surface has first and second conductive battery contacts protruding from the first battery surface, where the first and second conductive battery contacts are separated by a non-conductive portion of the first battery surface. The lithium-based battery is a type that undergoes an expansion during charging in which the expansion of the lithium-based battery includes an outward bulging of the non-conductive portion of the first battery surface. The method also includes providing a substrate having a substrate surface and first and second conductive substrate contacts protruding from the substrate surface, where the first and second conductive substrate contacts are separated by a non-conductive portion of the substrate surface. The method further includes coupling the lithium-based battery to the substrate. The coupling includes rigidly coupling the second battery surface to the non-conductive portion of the substrate surface via a layer of a non-conductive adhesive. The coupled also includes electrically connecting the first conductive battery contact to the first conductive substrate contact via a first portion of a flexible electrically-conductive adhesive, where the first portion allows for relative movement between the first conductive battery contact and the first conductive substrate contact caused by the expansion of the lithium-based battery. The coupling further includes electrically connecting the second conductive battery contact to the second conductive substrate contact via a second portion of a flexible electrically-conductive adhesive, where the second portion allows for relative movement between the second conductive battery contact and the second conductive substrate contact caused by the expansion of the lithium-based battery.

In still another aspect, the present disclosure describes a device. The device includes a lithium-based battery having a first battery surface and a second battery surface opposite the first battery surface. The first battery surface has first and second conductive battery contacts protruding from the first battery surface, where the first and second conductive battery contacts are separated by a non-conductive portion of the first battery surface. The lithium-based battery is a type that undergoes an expansion during charging in which the expansion of the lithium-based battery includes an outward bulging of the non-conductive portion of the first battery surface. The device also includes a substrate having a substrate surface and first and second conductive substrate contacts protruding from the substrate surface, where the first and second conductive substrate contacts are separated by a non-conductive portion of the substrate surface. The device further includes a non-conductive adhesive disposed between the second battery surface and the non-conductive portion of the substrate surface, where the non-conductive adhesive rigidly couples the second battery surface to the non-conductive portion of the substrate surface. The device also includes a first portion of a flexible electrically-conductive adhesive, where the first portion electrically connects the first conductive battery contact to the first conductive substrate contact and allows for relative movement therebetween caused by the expansion of the lithium-based battery. The device further includes a second portion of the flexible electrically-conductive adhesive, where the second portion electrically connects the second conductive battery contact to the second conductive substrate contact and allows for relative movement therebetween caused by the expansion of the lithium-based battery.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

The following detailed description describes various features and functions of the disclosed systems and methods with reference to the accompanying figures. In the figures, similar symbols identify similar components, unless context dictates otherwise. The illustrative system and method embodiments described herein are not meant to be limiting. It may be readily understood that certain aspects of the disclosed systems and methods can be arranged and combined in a wide variety of different configurations, all of which are contemplated herein.

I. Overview

A solid-state lithium-ion battery can be manufactured such that little or no elemental lithium is present in the battery when the battery is uncharged. This can be useful in situations where the battery will be integrated into another device that undergoes further processing. In particular, the presence of lithium may be undesirable in further processing steps that include exposure to oxygen, moisture, and/or heat conditions.

Figure 1:
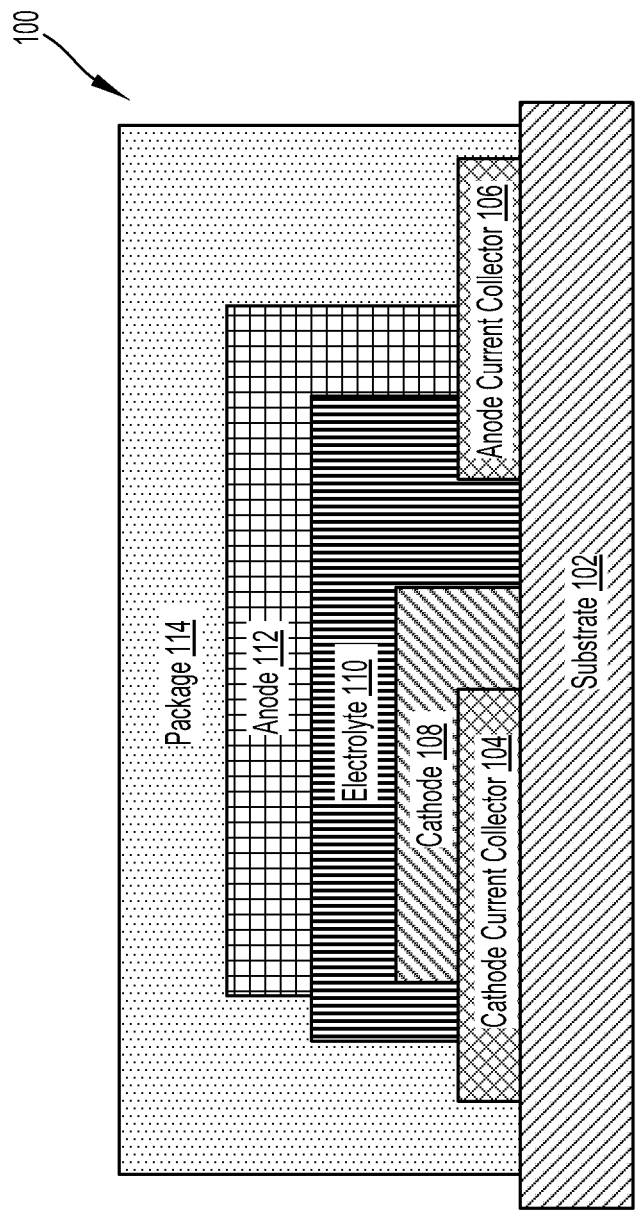
FIG. 1 illustrates a lithium-based battery, in accordance with an example implementation.

FIG. 1 illustrates a lithium-based battery 100, in accordance with an example implementation. More particularly, FIG. 1 shows an example materials stack in the lithium-based battery 100. As shown in FIG. 1, the lithium-based battery 100 may include the following layers: (1) a substrate 102; (2) a cathode current controller 104; (3) an anode current controller 106; (4) a cathode 108; (5) an electrolyte 110; (6) an anode 112; and (7) a package 114. These materials and layers are examples for illustration only. Other materials and stack configuration could be used in a lithium-based battery.

As mentioned above, when the lithium-based battery 100 is uncharged, lithium in elemental form is not present. During charging, however, lithium is produced and is plated between the anode 112 and the electrolyte 110. Also, charging the lithium-based battery 100 may produce pressure and heat inside the lithium-based battery 100. Production of lithium and/or generation of pressure and heat, or other factors, cause the battery to swell or expand. In some cases, the expansion may amount to about ⅓ the thickness of the cathode 108. The expansion can cause considerable stress and strain in a structure of the lithium-based battery 100. The stress and strain of the lithium-based battery 100 can be exacerbated by flip-chip bonding processing using epoxy-based adhesive materials, which are rigid when cured, for example, as described below with respect to FIGS. 2-5.

Figure 2:
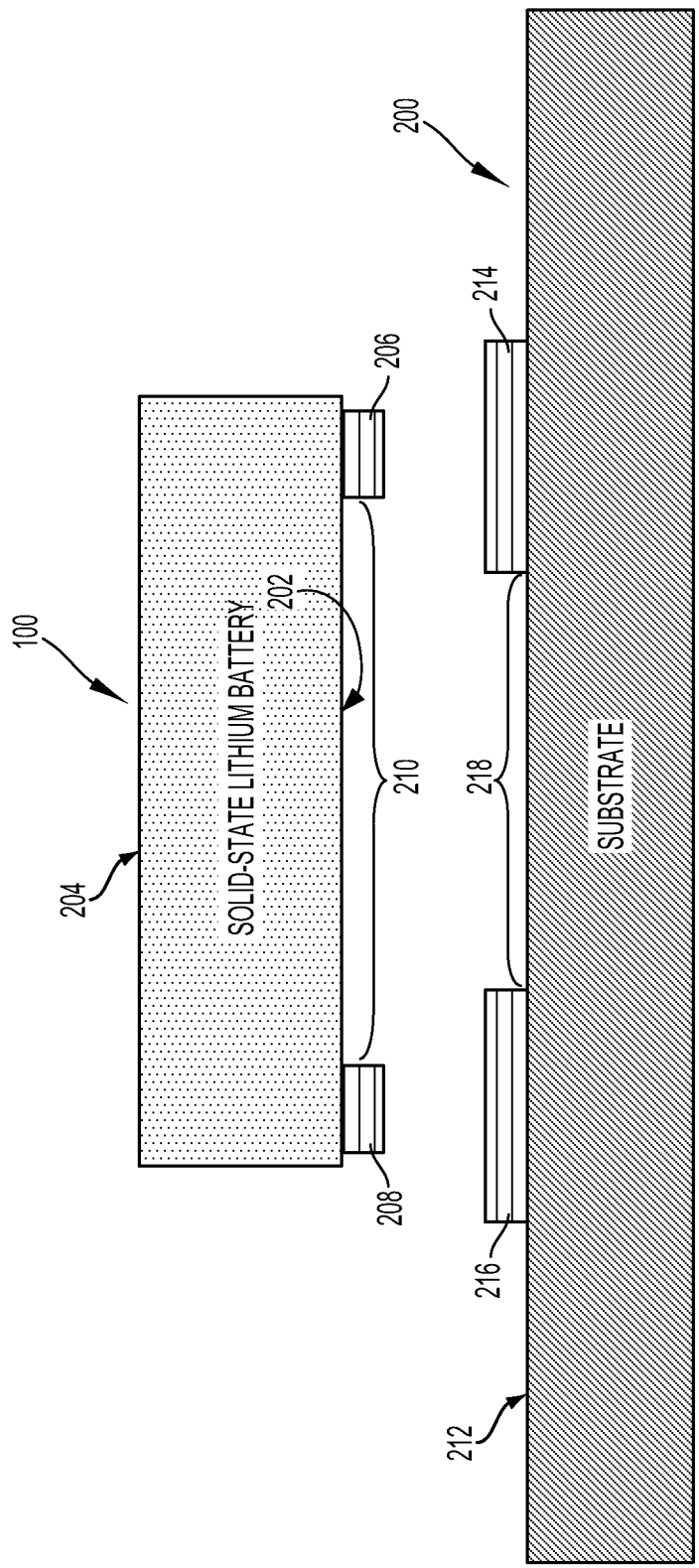
FIG. 2 illustrates the lithium-based battery and a substrate, in accordance with an example implementation.

In some examples, the lithium-based battery 100 is integrated into another device. In these examples, the lithium-based battery 100 may be coupled to a substrate to connect the lithium-based battery 100 to other components. FIG. 2 illustrates the lithium-based battery 100 and a substrate 200, in accordance with an example implementation. As shown in FIG. 2, the lithium-based battery 100 has a first battery surface 202 and a second battery surface 204 opposite the first battery surface 202. A first conductive battery contact 206 and a second conductive battery contact 208 protrude from the first battery surface 202. The first and second conductive battery contacts 206 and 208 are separated by a non-conductive portion 210 of the first battery surface 202.

The substrate 200 has a substrate surface 212. The substrate 200 also has a first conductive substrate contact 214 and a second conductive substrate contact 216 protruding from the substrate surface 212. The first and second conductive substrate contacts 214 and 216 are separated by a non-conductive portion 218 of the substrate surface 212.

Figure 3:
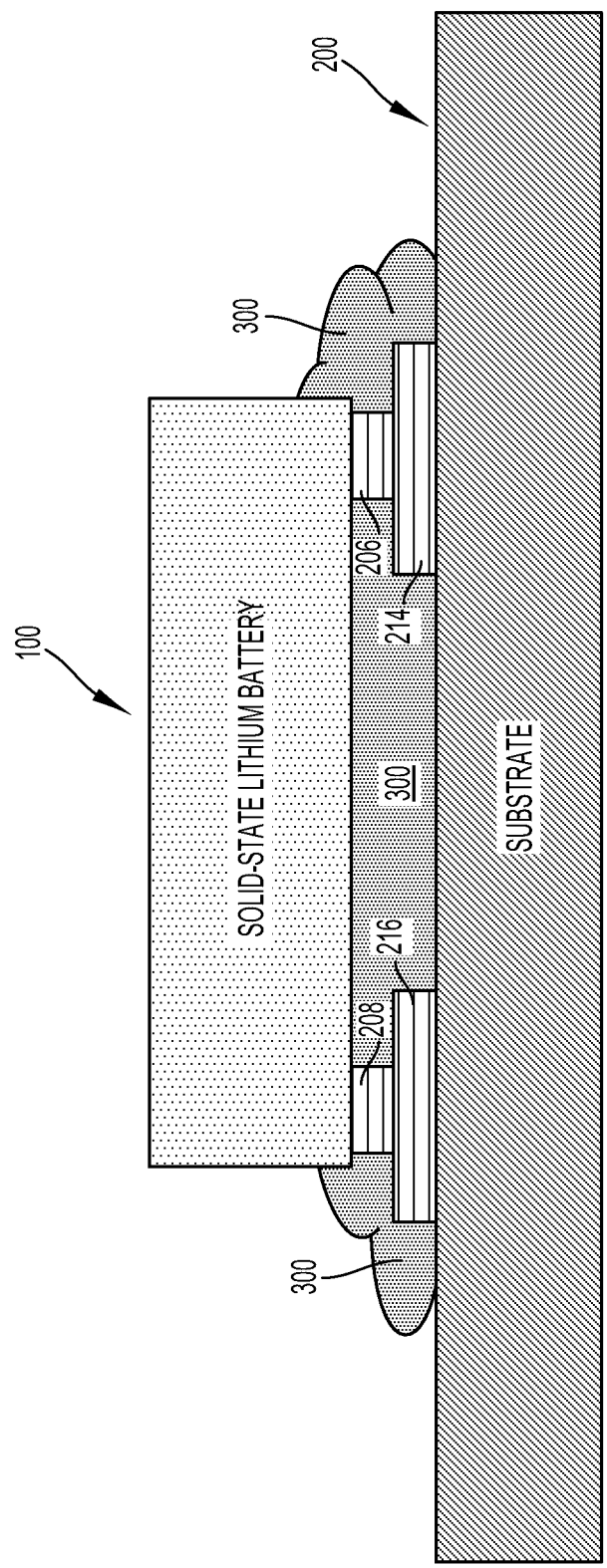
FIG. 3 illustrates the lithium-based battery coupled to the substrate using a rigid non-conductive adhesive, in accordance with an example implementation.

FIG. 3 illustrates the lithium-based battery 100 coupled to the substrate 200 using a rigid non-conductive adhesive 300, in accordance with an example implementation. As shown in FIG. 3, the conductive battery contact 206 contacts the conductive substrate contact 214, and the conductive battery contact 208 contacts the conductive substrate contact 216. The rigid non-conductive adhesive 300 is used to couple the lithium-based battery 100 to the substrate 200. In this manner, the conductive battery contact 206 is rigidly coupled to the conductive substrate contact 214, and the conductive battery contact 208 is rigidly coupled to the conductive substrate contact 216. The rigid non-conductive adhesive 300 could be, for example, an epoxy-based adhesive. The rigid non-conductive adhesive 300 does not allow relative motion between the lithium-based battery 100 and the substrate 200.

Figure 4:
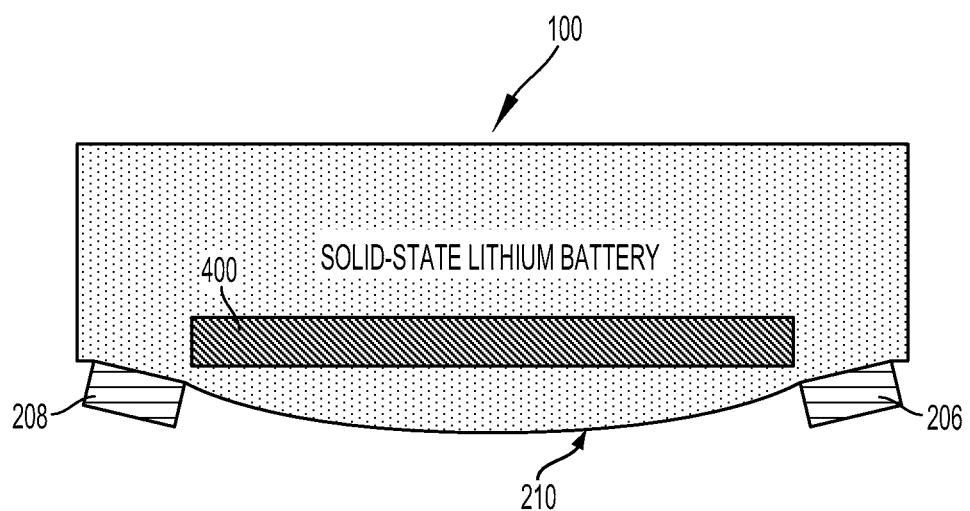
FIG. 4 illustrates expansion of the lithium-based battery, in accordance with an example implementation.

As mentioned above, the lithium-based battery 100 expands during charging. FIG. 4 illustrates expansion of the lithium-based battery 100, in accordance with an example implementation. As shown in FIG. 4, during charging, lithium 400 is produced, and possibly heat and pressure are also generated within the lithium-based battery 100. If the lithium-based battery 100 has room, it will swell and expand. Particularly, the non-conductive portion 210 of the battery surface 202 will bulge as shown in FIG. 4. However, referring back to FIG. 3, the rigid non-conductive adhesive 300 does not provide room for the lithium-based battery 100 to expand and does not allow for relative motion between the lithium-based battery 100 and the substrate 200. Consequently, stress and strain resulting during charging the lithium-based battery 100 will not be relieved.

Figure 5:
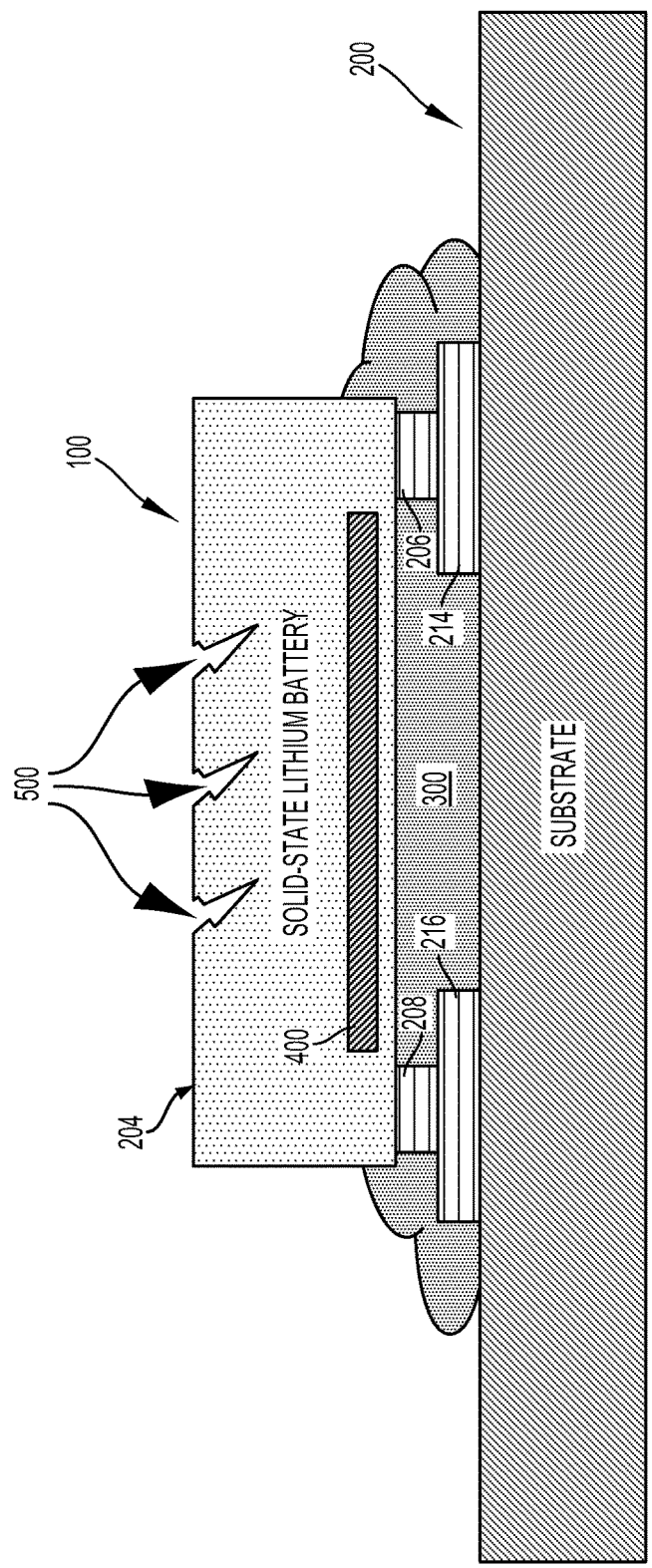
FIG. 5 illustrates cracking of the lithium-based battery due to the expansion, in accordance with an example implementation.

FIG. 5 illustrates cracking of the lithium-based battery 100 due to the expansion, in accordance with an example implementation. As shown in FIG. 5, because the lithium-based battery 100 does not have room to expand, and thus cannot relieve the stress and strain resulting from charging, cracking in the substrate 200 and/or active battery layers can develop. FIG. 5 depicts cracks 500 affecting the battery surface 204 and penetrates through several layers of the lithium-based battery 100. The cracks 500 are shown for illustration only. Cracks can develop in other parts such as the conductive contacts 206, 208, 214, and 216, and/or in the substrate 200. Thus, an improvement is desired to achieve electrical contact between the lithium-based battery 100 and the substrate 200 and also relieve the stress and strain resulting from battery expansion during charging.

II. Example Devices

Figure 6:
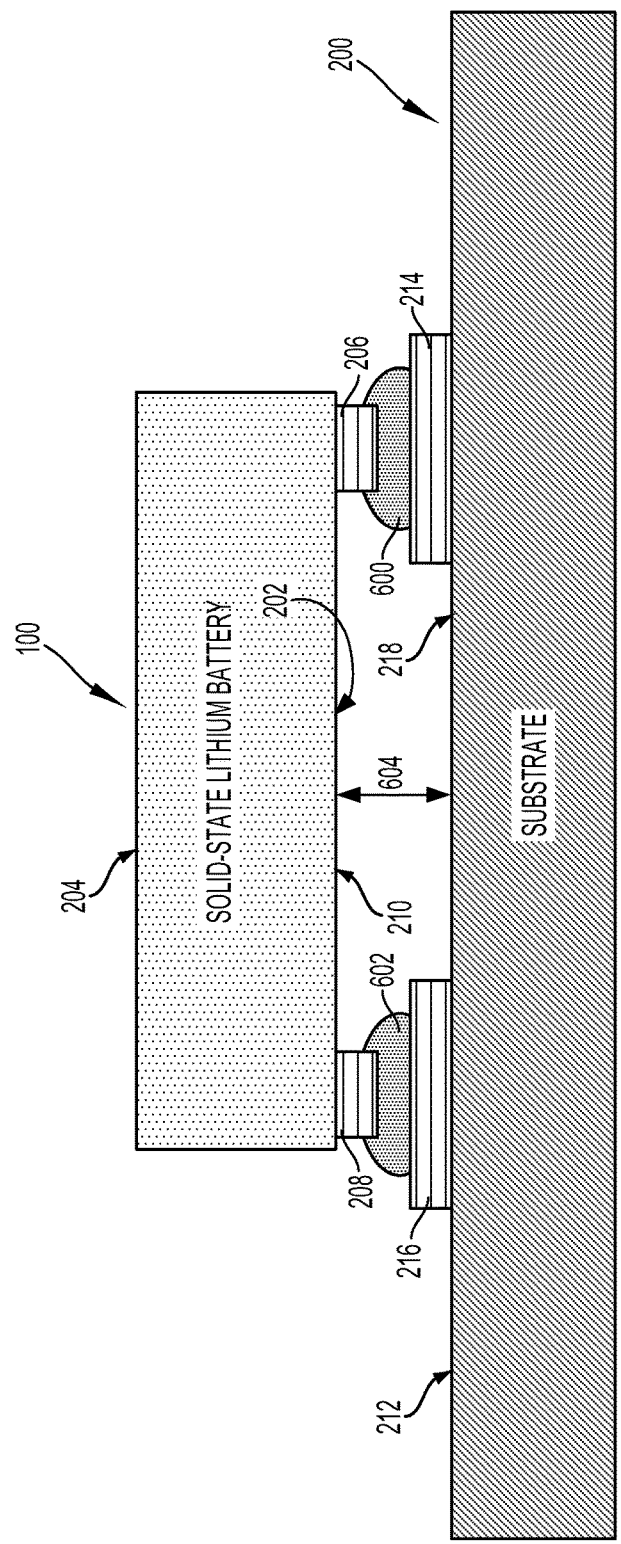
FIG. 6 illustrates the lithium-based battery coupled to the substrate using a flexible conductive adhesive, in accordance with an example implementation.

FIG. 6 illustrates the lithium-based battery 100 coupled to the substrate 200 using a flexible conductive adhesive, in accordance with an example implementation. Using a flexible conductive adhesive to form a flexible conductive link between the conductive battery contact 206 and 208 and the respective conductive substrate contacts 214 and 216 may allow for relief of the stress and strain caused by swelling/expansion of the lithium-based battery 100.

As shown in FIG. 6, the first conductive battery contact 206 is electrically connected to the first conductive substrate contact 214 via a first portion or a first layer 600 of a flexible electrically-conductive adhesive. As an example, the flexible conductive adhesive may be an isotropic conductive adhesive so that the first layer 600 of the flexible conductive material can physically separate the first conductive battery contact 206 from the first conductive substrate contact 214, yet maintain electrical contact therebetween. In examples, the isotropically conductive adhesive material of the first layer 600 includes a polymeric material containing metallic particles (e.g., silver flakes). In these examples, the metallic particle cause electrical connection between the first conductive battery contact and the first conductive substrate contact. An example of the flexible conductive material is DA-6534, sold by Dow Corning Corp., which is an isotropically conductive silicone-based adhesive. However, other flexible conductive materials are contemplated as well.

As depicted in FIG. 6, the first layer 600 of the flexible electrically-conductive adhesive physically separates the first conductive battery contact 206 from the first conductive substrate contact 214. Additionally, the first layer 600, because of its flexibility, allows for relative movement between the lithium-based battery 100 and the substrate 200 caused by the expansion of the lithium-based battery 100, and thus allows for relief of stress and strain resulting from the expansion of the lithium-based battery 100.

Similarly, as shown in FIG. 6, the second conductive battery contact 208 is electrically connected to the second conductive substrate contact 216 via a second layer 602 of the flexible electrically-conductive adhesive. The second layer 602 of the flexible electrically-conductive adhesive physically separates the second conductive battery contact 208 from the second conductive substrate contact 216 and allows for relative movement therebetween caused by the expansion of the lithium-based battery 100.

In examples, the first layer 600 and the second layer 602 may be patterned to form "bumps", on either the conductive battery contacts 206 and 208, or the conductive substrate contacts 214 and 216. Patterning the first layer 600 and the second layer 602 may simplify bonding or coupling process of the lithium-based battery 100 and the substrate 200. For instance, assuming that the first layer 600 and the second layer 602 are patterned on the conductive battery contacts 206 and 208, the lithium-based battery 100 may be aligned to the conductive substrate contacts 216 and 216 and placed in their appropriate locations with minimal application of pressure.

In the examples where the flexible conductive adhesive includes polymeric material, the first layer 600 and the second layer 602 may be patterned in an uncured state. Then, once the lithium-based battery 100 is correctly coupled to the substrate 200, the flexible conductive adhesive containing the polymeric material can be cured (e.g., on a hot plate or oven). Curing the polymeric material may remove any excess solvents and form a strong bond between the conductive battery contacts 206 and 208, and the respective conductive substrate contacts 214 and 216.

Patterning the first layer 600 and the second layer 602 may be performed using several techniques. For example, a syringe may be used to dispense the flexible conductive adhesive. In another example, a stencil-and-squeegee technique can be used. Other techniques are also contemplated.

Further, as depicted in FIG. 6, the lithium-based battery 100 is coupled to the substrate 200 such that a gap 604 separates the non-conductive portion 210 of the battery surface 202 from the non-conductive portion 218 of the substrate surface 212. The gap 604 can be sufficient to accommodate the outward bulging of the non-conductive portion 210 of the battery surface 202 during charging as described next.

Figure 7:
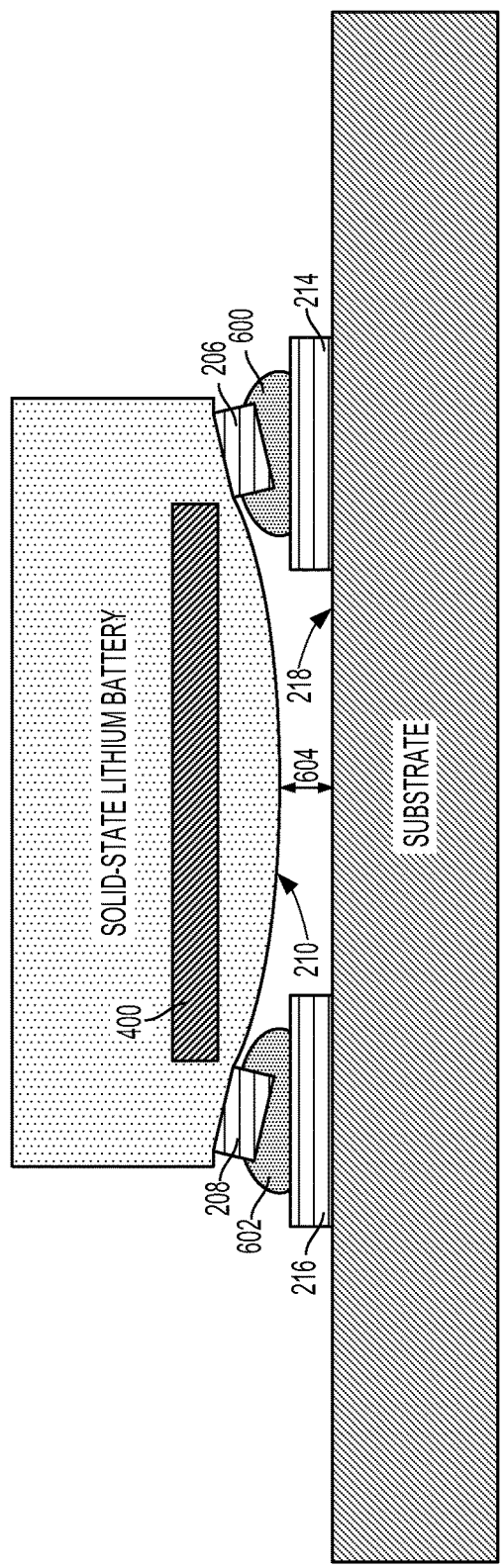
FIG. 7 illustrates accommodating expansion of the lithium-based battery, in accordance with an example implementation.

FIG. 7 illustrates accommodating expansion of the lithium-based battery 100, in accordance with an example implementation. FIG. 7 shows the configuration shown in FIG. 6 when the lithium-based battery 100 expands during charging. As depicted in FIG. 7, charging causes deformation in the structure of the lithium-based battery 100, and particularly causes the non-conductive portion 210 to bulge outwardly toward the non-conductive portion 218. However, because of the flexibility of the first layer 600 and the second layer 602, the deformation is accommodated. Specifically, the non-conductive portion 210 is allowed to bulge freely in the gap 604. Also, the conductive battery contacts 206 and 208 move relative to the respective conductive substrate contacts 214 and 216, yet electric connection is maintained therebetween via the first layer 600 and the second layer 602. Thus, the device illustrated in FIG. 6-7 minimizes stress developing in the battery structure and thus minimizes the likelihood of cracking the lithium-based battery 100.

In another example implementation, a non-conductive but flexible material could be used to bond the lithium-based battery 100 to the substrate 200. In this case, the bonding would be configured similar to the configuration of FIG. 3 except that instead of a rigid non-conductive material 300, a flexible adhesive (such as a silicone-based adhesive) is used. This configuration may provide an enhanced stress relief compared to the non-flexible material 300. However, the conductive battery contact 206 may be rigidly affixed to the conductive substrate contact 214, and the conductive battery contact 208 may be rigidly affixed to the conductive substrate contact 216. Thus such configuration might not provide relief from vertical strain that develops at contact points between the conductive battery contacts 206 and 208 and the conductive substrate contacts 214 and 216.

Figure 8:
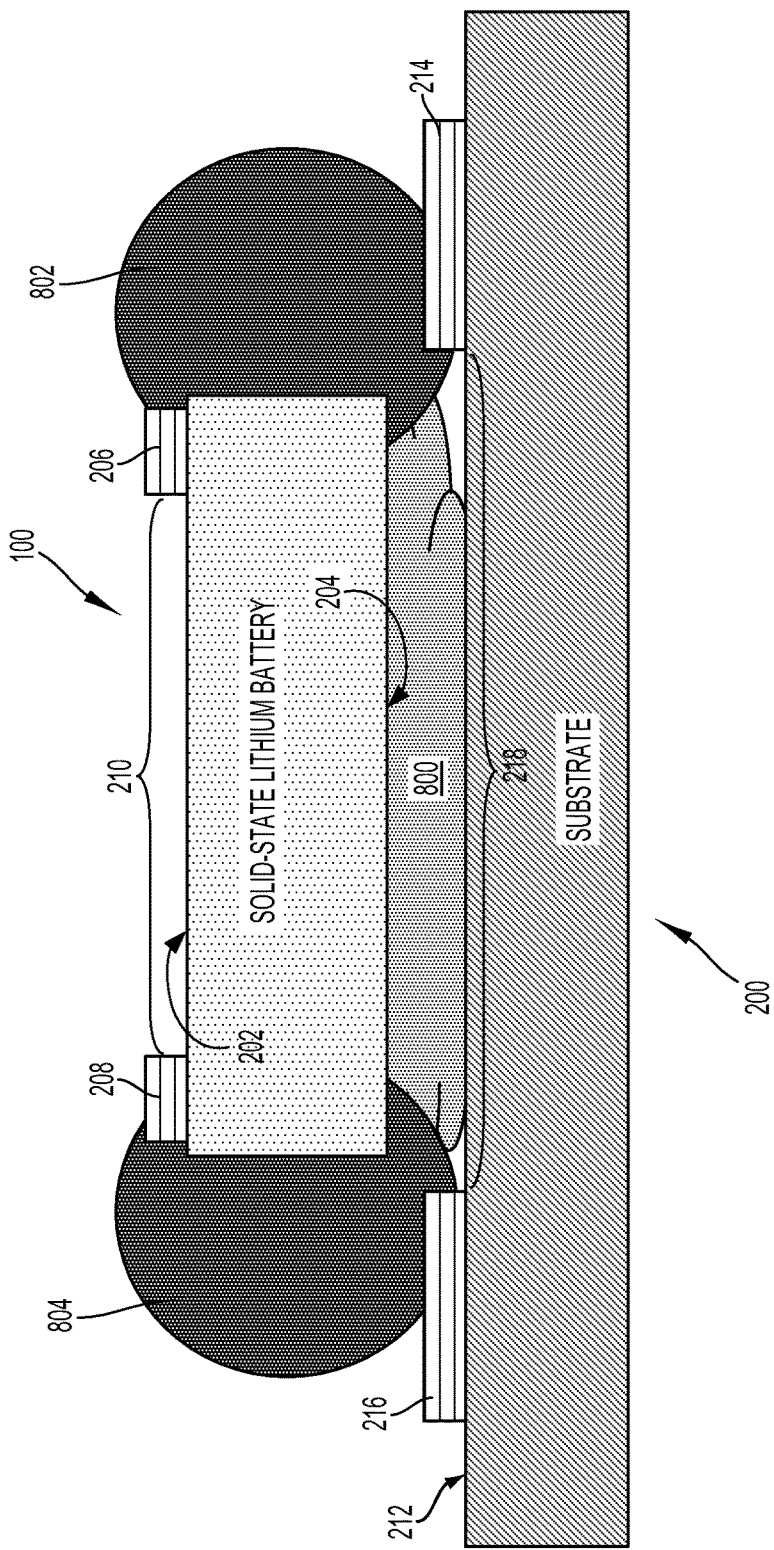
FIG. 8 illustrates the lithium-based battery coupled to the substrate using rigid non-conductive adhesive and a flexible conductive adhesive, in accordance with an example implementation.
Figure 9:
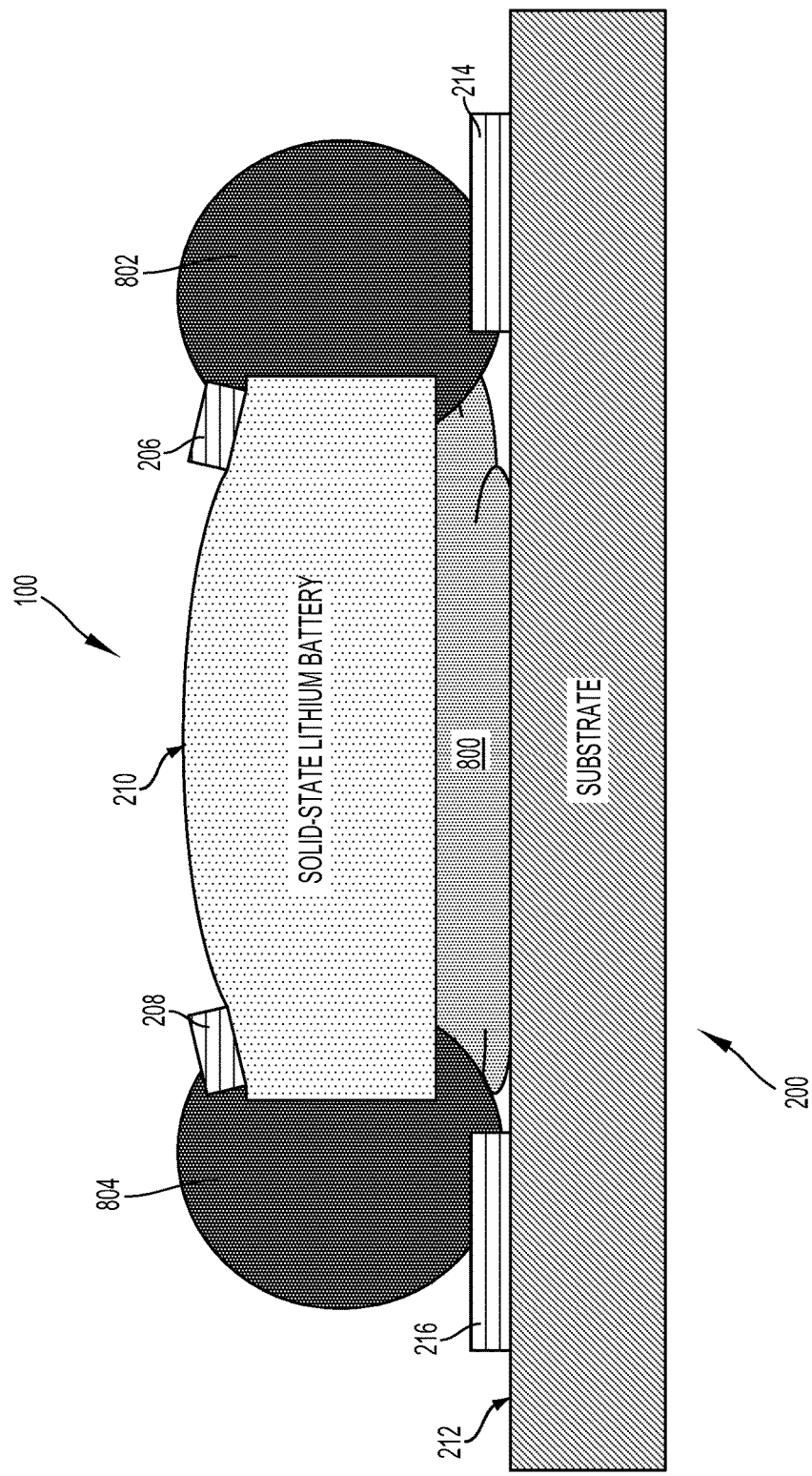
FIG. 9 illustrates accommodating expansion of the lithium-based battery using the configuration illustrated in FIG. 8, in accordance with an example implementation.

FIGS. 8 and 9 illustrates another example implementation. Specifically, FIG. 8 illustrates the lithium-based battery 100 coupled to the substrate 200 using a rigid non-conductive adhesive 800 and a flexible conductive adhesive, in accordance with an example implementation. FIG. 8 shows the lithium-based battery 100 flipped in comparison to the configuration of FIGS. 2-7 such that the first battery surface 202 is facing away from the substrate 200.

FIG. 8 depicts the non-conductive adhesive 800 disposed between the second battery surface 204 and the non-conductive portion 218 of the substrate surface 212. The non-conductive adhesive 800 rigidly couples the second battery surface 204 to the non-conductive portion 218 of the substrate surface 212. As an example for illustration, the rigid non-conductive adhesive 800 may be an epoxy based adhesive.

Further, a first portion 802 of a flexible electrically-conductive adhesive electrically connects the first conductive battery contact 206 to the first conductive substrate contact 214. The first portion 802 may be similar to the first layer 600 in FIG. 6. The first portion 802 of the flexible electrically-conductive adhesive allows for relative movement between the first conductive battery contact 206 and the first conductive substrate contact 214 that could be caused by the expansion of the lithium-based battery 100 during charging.

Similarly, a second portion 804 of the flexible electrically-conductive adhesive electrically connects the second conductive battery contact 208 to the second conductive substrate contact 216. The second portion 804 may be similar to the second layer 602 in FIG. 6. The second portion 804 of the flexible electrically-conductive adhesive allows for relative movement between the second conductive battery contact 208 and the first conductive substrate contact 216 that could be caused by the expansion of the lithium-based battery 100 during charging.

FIG. 9 illustrates accommodating expansion of the lithium-based battery using the configuration illustrated in FIG. 8, in accordance with an example implementation. FIG. 9 illustrates the configuration shown in FIG. 8 when the lithium-based battery 100 expands during charging. As mentioned above, and as depicted in FIG. 9, charging causes deformation in the structure of the lithium-based battery 100, and particularly causes the non-conductive portion 210 to bulge outwardly. However, because of the flexibility of the first portion 802 and the second portion 804, the deformation is accommodated. Specifically, the non-conductive portion 210 is allowed to bulge freely and thus cracks are not developed. Also, the conductive battery contacts 206 and 208 move relative to the respective conductive substrate contacts 214 and 216, yet electric connection is maintained therebetween. Thus, the device illustrated in FIG. 8-9 minimizes stress developing in the battery structure and thus minimizes likelihood of cracking the lithium-based battery 100.

III. Example Methods

Figure 10:
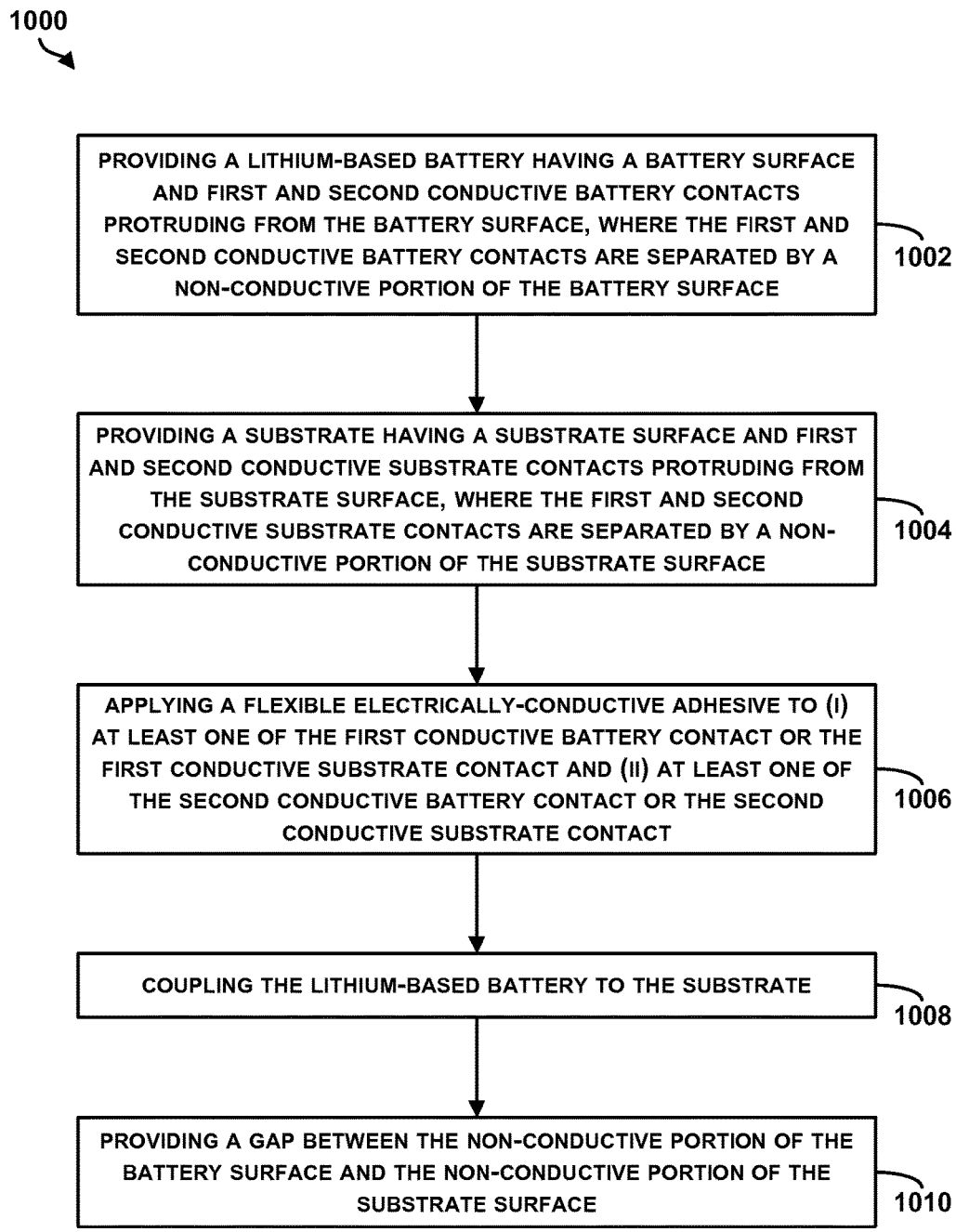
FIG. 10 is a flow chart of a method for coupling a lithium-based battery to a substrate, in accordance with an example implementation.

FIG. 10 is a flow chart of a method 1000 for bonding of solid-state lithium batteries, in accordance with an example implementation. The method 1000 may include one or more operations, functions, or actions as illustrated by one or more of blocks 1002-1010. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

At block 1002, the method 1000 includes providing a lithium-based battery having a battery surface and first and second conductive battery contacts protruding from the battery surface. The term "providing" as used herein with regard to a component includes any action to make the component available for use, such as bringing the component to an apparatus or to a work environment for further processing of the component (e.g., for coupling the component to another component).

In line with the discussion related to FIGS. 6 and 7, the first and second conductive battery contacts are separated by a non-conductive portion of the battery surface. The lithium-based battery is a type that undergoes an expansion during charging in which the expansion of the lithium-based battery includes an outward bulging of the non-conductive portion of the battery surface. For instance, as described with respect to FIG. 1, the lithium-based battery may include at least an anode layer and an electrolyte layer, and the expansion during charging is caused at least in part by production of lithium between the anode layer and the electrolyte layer during charging. Other factors may cause the expansion such as heat and pressure generated within the lithium-based battery during charging.

At block 1004, the method 1000 includes providing a substrate having a substrate surface and first and second conductive substrate contacts protruding from the substrate surface. The first and second conductive substrate contacts are separated by a non-conductive portion of the substrate surface.

At block 1006, the method 1000 includes applying a flexible electrically-conductive adhesive to (i) at least one of the first conductive battery contact or the first conductive substrate contact and (ii) at least one of the second conductive battery contact or the second conductive substrate contact. In examples, the flexible electrically-conductive adhesive is an isotropically conductive adhesive material. The isotropically conductive adhesive material may include a polymeric material (e.g., a silicone material) that contains metallic particles. The metallic particles may be effective to establish an electrical connection between the conductive battery contacts and the respective conductive substrate contacts. The isotropically conductive adhesive material may be applied with the polymeric material in an uncured state so as to facilitate application and aligning the lithium-based battery with the substrate. Thereafter, once the lithium-based battery is correctly coupled to the substrate, as described below at block 1008, the flexible conductive adhesive containing the polymeric material can be cured so as to remove any excess solvents and form a strong bond between the conductive battery contacts and the conductive substrate contacts 216 and 216.

At block 1008, the method 1000 includes coupling the lithium-based battery to the substrate. The coupling includes electrically connecting the first conductive battery contact to the first conductive substrate contact via a first layer of the flexible electrically-conductive adhesive. The first layer of the flexible electrically-conductive adhesive physically separates the first conductive battery contact from the first conductive substrate contact and allows for relative movement therebetween caused by the expansion of the lithium-based battery. Similarly, the coupling includes electrically connecting the second conductive battery contact to the second conductive substrate contact via a second layer of the flexible electrically-conductive adhesive. The second layer of the flexible electrically-conductive adhesive physically separates the second conductive battery contact from the second conductive substrate contact and allows for relative movement therebetween caused by the expansion of the lithium-based battery.

At block 1010, the method 1000 includes providing a gap between the non-conductive portion of the battery surface and the non-conductive portion of the substrate surface. This gap is designed to be sufficient to accommodate the outward bulging of the non-conductive portion of the battery surface. In this manner, because the first and second layers allow for relative motion between respective battery contacts and substrate contacts and the gap between the non-conductive portion of the battery surface and the non-conductive portion of the substrate surface, the lithium-based battery can expand freely during charging without developing cracks.

Figure 11:
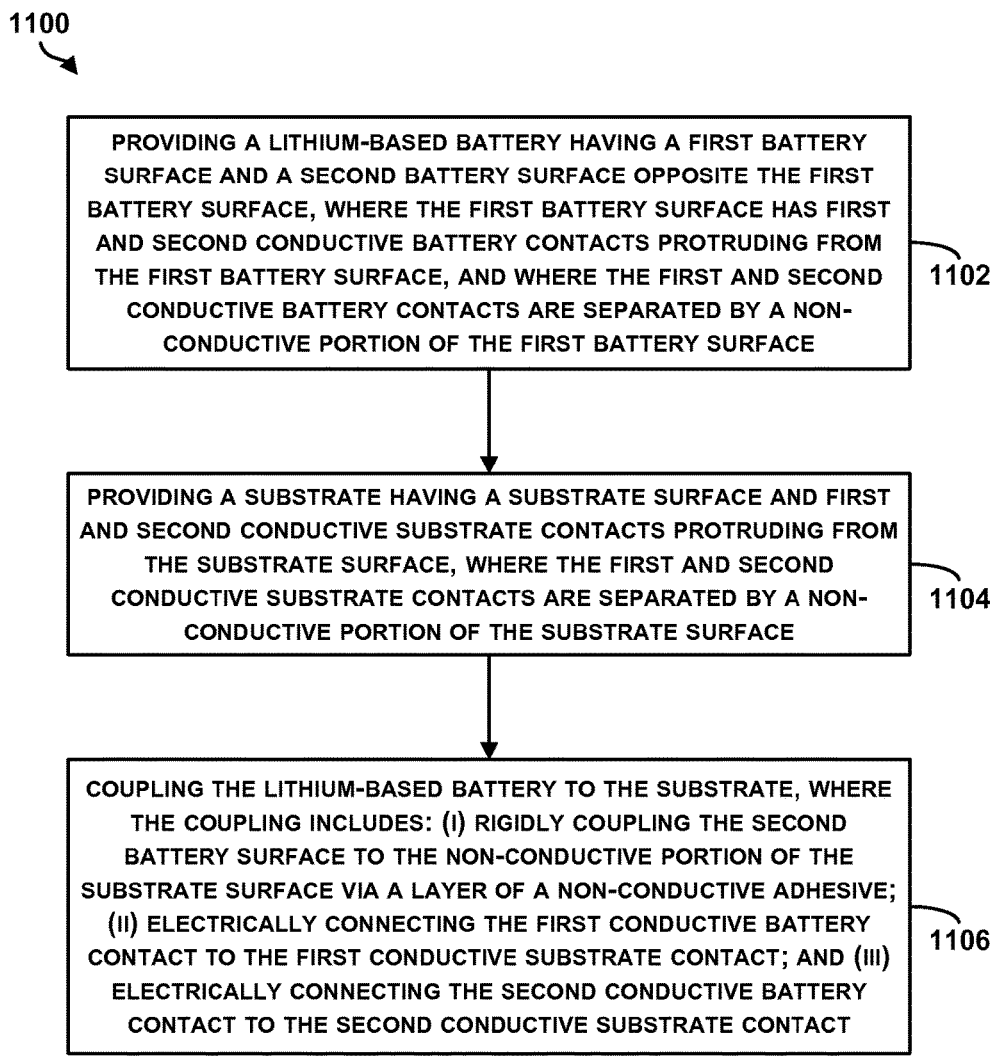
FIG. 11 is a flow chart of another method for coupling a lithium-based battery to a substrate, in accordance with an example implementation.

FIG. 11 is a flow chart of another method 1100 for bonding of solid-state lithium batteries, in accordance with an example implementation. The method 1100 may include one or more operations, functions, or actions as illustrated by one or more of blocks 1102-1106. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

At block 1102, the method 1100 includes providing a lithium-based battery having a first battery surface and a second battery surface opposite the first battery surface. In line with the discussion related to FIGS. 8 and 9, the first battery surface has first and second conductive battery contacts protruding from the first battery surface, where the first and second conductive battery contacts are separated by a non-conductive portion of the first battery surface. The lithium-based battery is a type that undergoes an expansion during charging in which the expansion of the lithium-based battery includes an outward bulging of the non-conductive portion of the first battery surface. For instance, as described with respect to FIG. 1, the lithium-based battery includes at least an anode layer and an electrolyte layer, and the expansion during charging is caused at least in part by production of lithium between the anode layer and the electrolyte layer during charging. Other factors may cause the expansion such as heat and pressure generated within the lithium-based battery during charging.

At block 1104, the method 1100 includes providing a substrate having a substrate surface and first and second conductive substrate contacts protruding from the substrate surface. The first and second conductive substrate contacts are separated by a non-conductive portion of the substrate surface.

At block 1106, the method 1100 includes coupling the lithium-based battery to the substrate. The coupling includes rigidly coupling the second battery surface to the non-conductive portion of the substrate surface via a layer of a rigid non-conductive adhesive. For instance, the rigid non-conductive adhesive may be an epoxy based adhesive.

The coupling also includes electrically connecting the first conductive battery contact to the first conductive substrate contact via a first portion of a flexible electrically-conductive adhesive. The first portion allows for relative movement between the first conductive battery contact and the first conductive substrate contact caused by the expansion of the lithium-based battery. The coupling further includes electrically connecting the second conductive battery contact to the second conductive substrate contact via a second portion of a flexible electrically-conductive adhesive. The second portion allows for relative movement between the second conductive battery contact and the second conductive substrate contact caused by the expansion of the lithium-based battery.

The flexible electrically-conductive adhesive could be, for example, an isotropically conductive adhesive material. In examples, the isotropically conductive adhesive material comprises a polymeric material (e.g., a silicone material) that contains metallic particles. The metallic particles may be effective to establish an electrical connection between the conductive battery contacts and the conductive substrate contacts. The method 1100 may further include applying the isotropically conductive adhesive material with the polymeric material in an uncured state to (i) at least one of the first conductive battery contact or the first conductive substrate contact and (ii) at least one of the second conductive battery contact or the second conductive substrate contact. Thereafter, the method 1100 may include curing the polymeric material to achieve a strong bond between the conductive battery contacts and the respective conductive substrate contacts.

IV. Conclusion

It should be understood that arrangements described herein are for purposes of example only. As such, those skilled in the art will appreciate that other arrangements and other elements (e.g., machines, interfaces, orders, and groupings of operations, etc.) can be used instead, and some elements may be omitted altogether according to the desired results.

While various aspects and implementations have been disclosed herein, other aspects and implementations will be apparent to those skilled in the art. The various aspects and implementations disclosed herein are for purposes of illustration and are not intended to be limiting, with the true scope being indicated by the following claims, along with the full scope of equivalents to which such claims are entitled. It is also to be understood that the terminology used herein is for the purpose of describing particular implementations only, and is not intended to be limiting.

What is claimed is:

1. A method comprising:
    providing a lithium-based battery having a battery surface and first and second conductive battery contacts protruding from the battery surface, wherein the first and second conductive battery contacts are separated by a non-conductive portion of the battery surface, and wherein the lithium-based battery is a type that undergoes an expansion during charging in which the expansion of the lithium-based battery includes an outward bulging of the non-conductive portion of the battery surface;
    providing a substrate having a substrate surface and first and second conductive substrate contacts protruding from the substrate surface, wherein the first and second conductive substrate contacts are separated by a non-conductive portion of the substrate surface;
    applying a flexible electrically-conductive adhesive to (i) at least one of the first conductive battery contact or the first conductive substrate contact and (ii) at least one of the second conductive battery contact or the second conductive substrate contact;
    coupling the lithium-based battery to the substrate, wherein the coupling comprises:
        electrically connecting the first conductive battery contact to the first conductive substrate contact via a first layer of the flexible electrically-conductive adhesive, wherein the first layer of the flexible electrically-conductive adhesive physically separates the first conductive battery contact from the first conductive substrate contact and allows for relative movement therebetween caused by the expansion of the lithium-based battery;
        electrically connecting the second conductive battery contact to the second conductive substrate contact via a second layer of the flexible electrically-conductive adhesive, wherein the second layer of the flexible electrically-conductive adhesive physically separates the second conductive battery contact from the second conductive substrate contact and allows for relative movement therebetween caused by the expansion of the lithium-based battery; and
    providing a gap between the non-conductive portion of the battery surface and the non-conductive portion of the substrate surface, wherein the gap is sufficient to accommodate the outward bulging of the non-conductive portion of the battery surface.

2. The method of claim 1, wherein the lithium-based battery includes at least an anode layer and an electrolyte layer, and wherein the expansion during charging is caused at least in part by production of lithium between the anode layer and the electrolyte layer during charging.

3. The method of claim 1, wherein the flexible electrically-conductive adhesive is an isotropically conductive adhesive material.

4. The method of claim 3, wherein the isotropically conductive adhesive material comprises a polymeric material containing metallic particles.

5. The method of claim 4, wherein applying the flexible electrically-conductive adhesive comprises applying the isotropically conductive adhesive material with the polymeric material in an uncured state.

6. The method of claim 5, further comprising:
    curing the polymeric material.

7. A device comprising:
    a lithium-based battery having a battery surface and first and second conductive battery contacts protruding from the battery surface, wherein the first and second conductive battery contacts are separated by a non-conductive portion of the battery surface, and wherein the lithium-based battery is a type that undergoes an expansion during charging in which the expansion of the lithium-based battery includes an outward bulging of the non-conductive portion of the battery surface; and
    a substrate having a substrate surface and first and second conductive substrate contacts protruding from the substrate surface, wherein the first and second conductive substrate contacts are separated by a non-conductive portion of the substrate surface,
    wherein the lithium-based battery is coupled to the substrate such that:
        the first conductive battery contact is electrically connected to the first conductive substrate contact via a first layer of a flexible electrically-conductive adhesive, wherein the first layer of the flexible electrically-conductive adhesive physically separates the first conductive battery contact from the first conductive substrate contact and allows for relative movement therebetween caused by the expansion of the lithium-based battery,
        the second conductive battery contact is electrically connected to the second conductive substrate contact via a second layer of the flexible electrically-conductive adhesive, wherein the second layer of the flexible electrically-conductive adhesive physically separates the second conductive battery contact from the second conductive substrate contact and allows for relative movement therebetween caused by the expansion of the lithium-based battery, and
        a gap separates the non-conductive portion of the battery surface and the non-conductive portion of the substrate surface, wherein the gap is sufficient to accommodate the outward bulging of the non-conductive portion of the battery surface.

8. The device of claim 7, wherein the lithium-based battery includes at least an anode layer and an electrolyte layer, and wherein the expansion during charging is caused at least in part by production of lithium between the anode layer and the electrolyte layer during charging.

9. The device of claim 7, wherein the flexible electrically-conductive adhesive is an isotropically conductive adhesive material.

10. The device of claim 9, wherein the isotropically conductive adhesive material comprises a silicone-based polymer and metallic particles.

* * * * *